United States Patent
Bachmann et al.

(10) Patent No.: US 9,425,807 B2
(45) Date of Patent: Aug. 23, 2016

(54) CIRCUIT FOR SYMBOL TIMING SYNCHRONIZATION

(71) Applicant: Stichting IMEC Nederland, Eindhoven (NL)

(72) Inventors: Christian Bachmann, Eindhoven (NL); Yan Zhang, Waalre (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 14/610,150

(22) Filed: Jan. 30, 2015

(65) Prior Publication Data

US 2015/0222419 A1    Aug. 6, 2015

(30) Foreign Application Priority Data

Jan. 31, 2014   (EP) ..................... 14153485

(51) Int. Cl.
*H04L 7/00* (2006.01)
*H03L 7/08* (2006.01)
*H04L 7/033* (2006.01)
*H04L 7/02* (2006.01)
(Continued)

(52) U.S. Cl.
CPC ............. *H03L 7/08* (2013.01); *H04L 7/0335* (2013.01); *H03L 7/091* (2013.01); *H04L 7/0004* (2013.01); *H04L 7/007* (2013.01); *H04L 7/0008* (2013.01); *H04L 7/0029* (2013.01); *H04L 7/0054* (2013.01); *H04L 7/0062* (2013.01); *H04L 7/02* (2013.01); *H04L 7/033* (2013.01); *H04L 7/0331* (2013.01); *H04L 27/2331* (2013.01)

(58) Field of Classification Search
CPC ............ H04L 7/0062; H04L 27/2331; H04L 7/0004; H04L 7/0029; H04L 7/0054; H04L 7/007
See application file for complete search history.

(56) References Cited

U.S. PATENT DOCUMENTS 5,473,637 A * 12/1995 Gardner ................. 375/329
6,154,510 A * 11/2000 Cochran et al. .......... 375/371
(Continued)

FOREIGN PATENT DOCUMENTS

WO     00/67420 A1    11/2000

OTHER PUBLICATIONS

Extended European Search Report, European Patent Application No. 14153485.9, dated May 15, 2014.
(Continued)

*Primary Examiner* — Ross Varndell
(74) *Attorney, Agent, or Firm* — McDonnell Boehnen Hulbert & Berghoff LLP

(57) ABSTRACT

The present disclosure relates to a timing synchronization circuit for a digital receiver structure that includes a timing error detection module comprising a phase difference calculation unit arranged for calculating a phase difference between incoming samples of a digital data stream, and a timing error estimator arranged for determining a timing error estimate based on the calculated phase difference, and for generating, based on the determined timing error estimate, a signal indicative of timing error detection. The circuit also includes a timing error control module arranged for receiving the signal indicative of timing error detection, for evaluating the number of received signals indicative of timing error detection and for outputting, after comparison with a threshold value, a sampling adjustment command for adjusting the sampling instants applied for obtaining the digital data stream.

14 Claims, 2 Drawing Sheets

(51) Int. Cl.
 *H04L 27/233* (2006.01)
 *H03L 7/091* (2006.01)

(56) References Cited

U.S. PATENT DOCUMENTS

| | | | | |
|---|---|---|---|---|
| 6,567,480 | B1* | 5/2003 | Brardjanian et al. | 375/331 |
| 6,985,549 | B1* | 1/2006 | Biracree et al. | 375/355 |
| 8,175,202 | B2* | 5/2012 | Capretta et al. | 375/350 |
| 8,249,198 | B2* | 8/2012 | Tsuwa | 375/330 |
| 2001/0019593 | A1* | 9/2001 | Greaves | H04L 27/2662 375/355 |

OTHER PUBLICATIONS

Wu, Yichen et al., A Universal Synchronization Algorithm of Joint Timing—Carrier in All Digital Receivers, 2012 2nd International Conference on Consumer Electronics, Communications and Networks (CECNet), Apr. 21-23, 2012, pp. 1597-1599.

Liu, Der-Zheng et al., "Synchronization Scheme in Non-Coherent Demodulator for TDMA Digital Mobile Radio System", Proc. Int'l Symposium on Circuits and Systems, ISCAS1999, vol. 4, Jul. 1999, pp. 463-466.

\* cited by examiner

CIRCUIT FOR SYMBOL TIMING SYNCHRONIZATION

CROSS-REFERENCE TO RELATED APPLICATION

This application claims priority to European Patent Application No. 14153485.9 filed on Jan. 31, 2014, the contents of which are hereby incorporated by reference

TECHNICAL FIELD

The present disclosure is generally related to the field of timing synchronization circuits.

BACKGROUND

Ultra-low-power (ULP) short-range wireless connectivity is becoming increasingly relevant to a wide range of sensor and actuator node applications ranging from consumer life style to medical applications. In recent years a multitude of wireless standards has been proposed to meet differing requirements of individual application domains such as data rates, range, Quality-of-Service (QoS), and peak and average power consumption. From a commercial perspective, a single radio component supporting multiple wireless standards—targeting at multiple application domains/markets—while reducing integration costs is preferable. In particular for mobile applications, reduction of radio power consumption and hence also synchronization hardware power consumption is of importance to allow for small device form factors and long operating times. At the same time, various wireless standards, utilizing different modulation schemes, have to be supported by a single radio architecture which may not compromise low power operation or suitable silicon area.

An important part of establishing and maintaining a wireless communication link between two radio transceivers is the timing synchronization of the receiver with the transmitter system. A general problem of timing synchronization in wireless systems is to find near-optimum sampling instants of baseband signals. Typically, receivers are sampling the baseband signal at a rate higher than the baseband symbol transmission rate, employing a certain oversampling ratio N, yielding a number of N samples representing each baseband symbol. The timing synchronization unit serves the purpose of determining near-optimum sampling timing instants of the oversampled baseband signals for given baseband symbols.

The present disclosure is specifically concerned with circuits for timing synchronization, which form an important aspect in the design of a communication system.

FIG. 1 illustrates the principle of the symbol timing synchronization based on a timing error function for an arbitrary baseband signal. For the given example, the optimum sampling instants are represented by the positive and negative peak values as well as by the zero-crossing instant (shown with arrows) of given baseband signal. In an aligned sampling case, e.g., the actual sampling instant is aligned with the desired sampling instants, for example, represented by the peak value of the illustrated triangular signal. In this case, a timing error function evaluating the sampling alignment outputs a near-zero value indicating little or no timing error. In the non-aligned sampling cases, e.g., when the sampling instant is too early or too late, the timing error function outputs a large magnitude with a negative or positive sign depending on whether the baseband signal was sampled early or late with respect to the desired sampling instants.

The task of finding the optimal baseband symbol sampling instant typically comprises the following subparts:
 a) detecting a timing offset,
 b) determining how to adjust the timing, and
 c) actually compensating for the timing offset.

For digital radio receivers, different circuits have been proposed for subtask a), such as circuits based on Gardner, early-late gate, Muller & Muller, correlation algorithms, etc. For subtask b), typically loop filters based on PID controllers or similar schemes are employed. For subtask c), compensation in the digital domain (interpolation filters) or feedback to control the ADC clock have been proposed. Many proposed solutions are tailored to a particular modulation scheme/wireless standard and lack the flexibility to operate on different modulation schemes.

Techniques for determining the optimal baseband symbol sampling instant have been well studied in the art. Conventional solutions, however, are tailored to a particular modulation scheme or a wireless standard and lack flexibility to operate on different modulation schemes. Furthermore, they are typically only used for timing acquisition in the preamble section of the wireless data packet, while for timing tracking another circuit is required as the data payload is unknown. In addition they contain high complexity modules such as correlators, interpolators and decimation filters, and the like. This increases the computational as well as the circuit complexity, and may lead to higher power consumption and larger silicon area.

Traditionally, correlation-based approaches are frequently used for timing acquisition between transmitter (TX) and receiver (RX) systems. However, correlation-based approaches are typically only employed for initial timing acquisition, not for timing tracking during frame reception, because of the higher costs in terms of power consumption (needs to be continuously active during the whole frame). Furthermore, these approaches rely on the occurrence of correlation patterns which is typically only the case for the preamble of a frame but not for the payload part (abbreviated as PSDU). Hence, they will generally only work for a predefined pattern over multiple symbols during preamble reception (where the expected sequence of symbols is known) but for timing correction during PSDU reception (timing tracking), where the incoming symbol sequence is not known on the receiver side, another approach should be used. Besides, they are typically operating on higher-rate oversampled data (e.g., 8 samples per symbol).

Conventionally, the Gardner algorithm is used for timing tracking in a PSK type of system after the acquisition. It only requires 2 samples per symbol and hence the processing rate or clock speed can be lower. Note that timing tracking is also important because timing drifts during the packet. Without timing tracking, the optimal sampling point will drift away.

As already mentioned, several problems can be identified concerning current solutions for baseband symbol timing synchronization. One has to deal with a multitude of wireless standards (e.g., for personal area networks (PANs)) based on different modulation schemes with different symbol timing synchronization requirements that needs to be supported by a single architecture. Current approaches offer limited flexibility (e.g., single standard support), hence a multitude of timing synchronization circuits is required to support different wireless standards. Another problem relates to the high complexity of the applied timing synchronization algorithms. Further, different circuits are needed for performing initial timing synchronization and timing tracking, which additionally contributes to higher complexity, higher power and area consumption.

To demonstrate the different requirements for initial timing synchronization for different modulation schemes, a brief recapitulation of some basic information on the latter is now provided.

Frequency-shift keying (FSK) is a frequency modulation scheme in which information is carried via discrete frequency changes. The modulated signal is discontinuous at the symbol switching time. Therefore, it is also called discontinuous-phase FSK. The sharp phase transitions result in relatively prominent side-lobe levels of the signal spectrum compared to the main lobe, which means the signal should be transmitted in a wider frequency band, otherwise it ends up with increased interference levels in the adjacent channels.

In order to solve this problem, Continuous Phase Frequency Shift Keying (CPFSK) was introduced. The phase continuity yields high spectral efficiency and the constant envelope yields excellent power efficiency. CPFSK belongs to the big family of Continuous Phase Modulation (CPM). A CPM modulated signal can be expressed as $$s(t) = \sqrt{\frac{2\mathcal{E}}{T}} \cos[2\pi f_c + \phi(t; I) + \phi_0] \quad (1)$$

where $\Phi_0$ is the initial phase of the carrier and $\phi(t; I)$ is given as $$\phi(t; I) = 2\pi \sum_{k=-\infty}^{n} I_k h_k q(t-kT), nT \leq t \leq (n+1)T \quad (2)$$

here $\{I_k\}$ is the sequence of M-ary information symbols selected from the alphabet ±1, ±3, ..., ±(M−1), $\{h_k\}$ is a sequence of modulation indices and q(t) is the normalized waveform shape. If $h_k$=h for all k, the modulation index is fixed for all symbols and is given as $$h = 2f_d T \quad (3)$$

In equation (3) $f_d$ is the peak frequency deviation and T is the symbol duration in seconds. The waveform q(t) may be represented, without a loss of generality, as the integral of some pulse shape g(t), i.e., $$q(t) = \int_{-\infty}^{t} g(\tau) d\tau \quad (4)$$

If g(t)=0, t>T, the CPM signal is called full response, otherwise the modulated signal is referred to as partial response CPM.

In CPM each symbol is modulated by gradually changing the phase of the carrier from the starting value to the final value, over the symbol duration. The modulation and demodulation becomes more complex given the fact that the initial phase of each symbol is determined by the cumulative total phase of all previous transmitted symbols, which is known as the phase memory. Therefore, the receiver cannot make decisions on any isolated symbol without taking the previous symbols into account.

Minimum Shift Keying (MSK) modulation is a special subclass of CPFSK modulation with a frequency separation of one-half the bit rate, or one says the modulation index h=½. Offset Quadrature Phase-shift Keying (OQPSK) is a variant of QPSK. It is sometimes called Staggered QPSK (SQPSK). In QPSK two bits can change at the same time to jump from one symbol to another, and hence it allows the phase of the signal to jump by as much as 180° at a time. When the signal is low-pass filtered (as is typical in a transmitter), these phase shifts result in large amplitude fluctuations. By offsetting the timing of the odd and even bits by one bit-period, or half a symbol period, it is assured that the in-phase and quadrature components do not change at the same moment. This means the phase-shift in the constellation will not be more than 90° at a time. This yields much lower amplitude fluctuations than non-offset QPSK. By applying half-sine pulse shaping to OQPSK, it is equivalent to MSK.

Different from the original MSK or FSK, in a GMSK or GFSK transmitter, the digital data stream is shaped with a Gaussian filter before being applied to a frequency modulator. The advantage is in reduced sideband power, which in turn reduces interference in adjacent frequency channels. However, the drawback is that the Gaussian filter increases the modulation memory in the system and causes inter-symbol interference. The Gaussian filter is specified by bandwidth symbol time product $BT_b$. For smaller values of $BT_b$, the spectral side-lobes are reduced further, but the inter-symbol interference (ISI) increases.

The optimum GFSK demodulator is a trellis-based Viterbi decoder, where it always assumes a certain nominal value for the modulation index h. However, the modulation index in Bluetooth Low Energy systems, for example, is allowed to vary within the range of 0.45-0.55, which leads to a varying trellis structure for sequence detection with possibly a large number of states. Therefore, in low power design, non-coherent suboptimal receivers are typically used to demodulate GFSK signals. As indicated by equation (2), in one symbol period the phase trellis of a GFSK signal is piece-wise monotonic. The direction of the monotonic change is determined by the binary symbol value. Hence, a differential demodulator can be employed. A differential demodulator involves sampling $\phi(t)$ at symbol rate to obtain $\phi(nT)$ and then taking the difference of the neighbouring samples $$\Delta\phi(nT) = \phi(nT) - \phi(nT-T) \quad (5)$$

A decision can be made based on the sign of $\Delta\phi(nT)$. The same differential detector can be applied to MSK and CPFSK as well.

In differentially encoded BPSK a binary '1' may be transmitted by adding 180° to the current phase and a binary '0' by adding 0° to the current phase. Another variant of DPSK is Symmetric Differential Phase Shift keying, SDPSK, where encoding would be +90° for a '1' and −90° for a '0'. It is obvious a differential demodulator applies well to a DPSK/SDPSK system, where the demodulator determines the changes in the phase of the received signal rather than the absolute phase itself.

In U.S. Pat. No. 8,249,198 a demodulation circuit is disclosed for differential phase shift keying (DPSK) modulated signals. A phase difference data generator compares phase data representing a phase of the received signal input at every predetermined sampling time with previous phase data preceding by one symbol time to generate phase difference data representing a phase shift amount of the phase data. A symbol selection unit evaluates the phase difference data generated at every sampling time to select as a symbol. In other words, a symbol phase based approach is adopted. The proposed solution involves a high computational complexity and is vulnerable to frequency offset.

The paper "Synchronization Scheme in Non-Coherent Demodulator for TDMA Digital Mobile Radio System" (Liu et al, Proc. Int'l Symposium on Circuits and Systems, ISCAS1999, vol. 4, pp. 463-466, 1999) presents a synchronization scheme in a non-coherent demodulator for a TDMA digital mobile radio system. The proposed synchronization scheme is combined with non-linear symbol timing recovery using Gardner's timing error detector and also deals with frequency offset compensation. A differential detector is used with a fixed delay for demodulating input IQ data before performing timing error detection. This approach, however, is limited to a specific baseband modulation scheme and/or symbol rate, i.e. DQPSK. Furthermore, the output of the differential detector, and hence, the subsequent timing error detector is affected by the input signal amplitude. Another limitation is that the carrier frequency offset compensation is applied to the signal after the timing error estimation. Therefore, for large frequency offsets, e.g., as defined in the Bluetooth Low Energy standard, the timing error estimator as described cannot function. Furthermore, the proposed solution directly modifies the sampling process of the ADC in the analog domain, which adds complexity to the ADC design and leads to phase distortion and slower timing loop settling time of the timing compensation.

Hence, there is a need for a timing synchronization circuit wherein one or more of these drawbacks are avoided or overcome.

SUMMARY OF THE DISCLOSURE

It is an object of embodiments of the present disclosure to provide for a low-complexity timing synchronization circuit that can be used with a variety of modulation schemes. It is a further object of the disclosure to provide for a timing synchronization circuit that can be used both for acquisition and tracking.

The above objectives may be accomplished by the solution according to the present disclosure.

In a first aspect, the disclosure relates to a timing synchronization circuit for a digital receiver structure that includes a timing error detection module comprising a phase difference calculation unit arranged for calculating a phase difference between incoming samples of a digital data stream, and a timing error estimator arranged for determining a timing error estimate based on the calculated phase difference, and for generating, based on the determined timing error estimate, a signal indicative of timing error detection. The circuit also includes a timing error control module arranged for receiving the signal indicative of timing error detection, for evaluating the number of received signals indicative of timing error detection and for outputting, after comparison with a threshold value, a sampling adjustment command for adjusting the sampling instants applied for obtaining the digital data stream.

The proposed solution allows for use with various standards by operating on phase differences between samples of the digital data stream. Based on the phase difference, a timing error estimate is derived based on which it is decided whether or not a timing error has occurred. A corresponding signal is then output to the timing error control block. The latter then decides whether or not any change to the timing of the sampling instants is needed. As detailed below, the timing synchronization circuit of the disclosure may offers the additional benefit that it can be used both for acquisition and tracking.

In a preferred embodiment the phase difference calculation unit is adapted for implementing a configurable delay. This is an advantageous feature in case the circuit needs to be configured for use with another standard.

Preferably the incoming samples are applied in in-phase/quadrature pairs.

In an advantageous embodiment the timing error estimator comprises a register of configurable length for storing a plurality of the timing error estimates.

In one embodiment the timing synchronization circuit is arranged for performing an averaging of the stored timing error estimates, yielding an averaged timing error estimate Preferably the signal indicative of timing error detection comprises an indication of the polarity of the timing error estimate.

The timing error estimator is arranged for comparing the timing error estimate or the averaged timing error estimate with a threshold level.

In another embodiment the timing error detection module is arranged for performing a downsampling on the timing error estimates.

In a preferred embodiment the incoming samples are modulated according to a frequency shift keying or phase shift keying modulation scheme.

In another aspect the disclosure relates to a digital receiver structure comprising a timing synchronization circuit as previously described.

In one embodiment the digital receiver structure comprises a downsampling block arranged for downsampling a received input stream, thereby obtaining the digital data stream.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

DESCRIPTION OF THE DRAWINGS

The disclosure will now be described further, by way of example, with reference to the accompanying drawings, wherein like reference numerals refer to like elements in the various figures.

DETAILED DESCRIPTION

Figure 1:
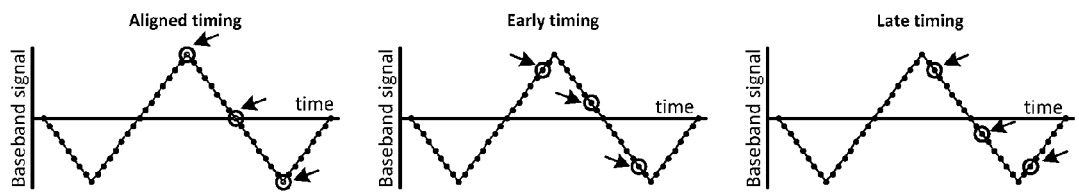
FIG. 1 illustrates the principle of symbol timing synchronization.

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The present disclosure proposes a timing synchronization circuit that can be used in combination with various communication standards. The proposed communication scheme fits particularly well with communication schemes wherein signals are modulated according to an FSK or PSK modulation scheme, such as FSK, GFSK, MSK, GMSK, O-QPSK, D-PSK, and the like.

Figure 2:
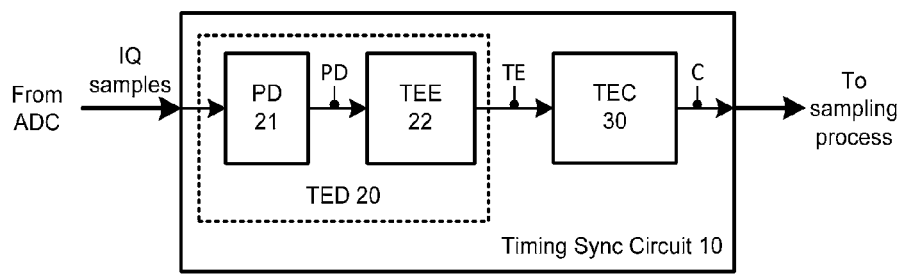
FIG. 2 illustrates a high level block scheme of the timing synchronization circuit according to an embodiment of the disclosure.

The timing synchronization unit serves the purpose of determining near-optimum sampling timing instants of the oversampled baseband signals. FIG. 2 shows a high-level overview of the timing synchronization module 10 that comprises a timing error detection (TED) module 20 and a timing error control (TEC) unit 30. The TED 20 determines a timing error estimate based on which timing errors are detected. The TEC 30 evaluates the detected timing errors TE and outputs, in case the detected timing error is above a certain threshold value, a command to adjust the downsampling process.

Figure 3:
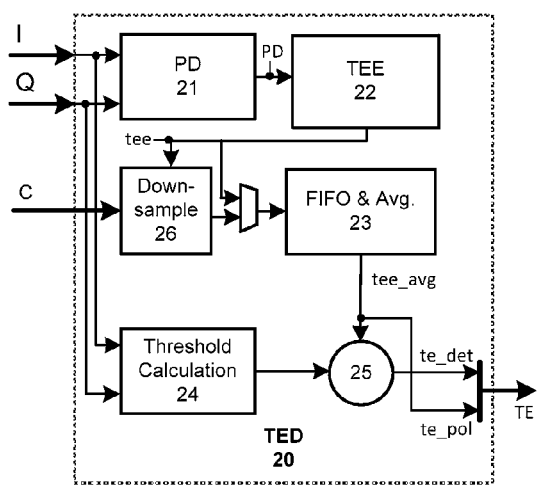
FIG. 3 illustrates an embodiment of the timing error detection module of FIG. 2.

The timing error detection (TED) module 20 will be explained in more detail below with reference to FIG. 3, wherein one embodiment of the TED module is shown. The TED module 20 calculates the timing error signal utilizing a phase difference (PD) calculation unit 21 and a timing error estimator (TEE) 22. The TED module 20 receives as input the incoming data samples. The incoming data samples are first converted to phase difference data PD in the calculation unit 21. The PD data is next processed in the timing error estimator 22, wherein a timing error function is implemented, such as a modified version of the Gardner algorithm. It is to be noted that other timing error functions, e.g., original Gardner algorithm, early-late gate, Mueller and Muller, etc. may be used instead.

The incoming data samples may be phase data samples or I/Q data sample pairs. If the incoming data samples are not downsampled before the TED module to actual symbol rate, additional downsampling is performed by an optional downsample circuit 26 to obtain a timing error estimate per symbol. The timing error estimate per symbol (signal tee in FIG. 3) is fed to an averaging circuit 23, which calculates an average timing error estimate value tee_avg. As the timing error may be a positive or a negative value, the sign value of the average value is indicative of the average timing error behaviour (early/late). A comparator circuit 25 compares the timing error value to a timing error threshold provided by the threshold calculation circuit 24. The threshold calculation circuit 24 may be configured to calculate the threshold value in a static or a dynamic manner. The threshold value may be calculated dynamically within the TED module to adjust the threshold value to varying signal amplitudes. If the averaged timing error is above the calculated threshold, the comparator 25 outputs a timing error detected signal te_det. The TED module 20 thus outputs a timing error signal TE comprised of the timing error detection te_det and a timing error polarity te_pol indication.

In comparison to correlation based technique comprising a correlator containing a number of multipliers and adders, the solution according to the disclosure uses a multiplier-less, low complexity timing error estimation. In a preferred embodiment the TEE 22 realizes a modified version of the Gardner algorithm in the form of $u(r)=y(r-½)[sgn(y(r))-sgn(y(r-1))]$, where $y(r)$ represents the phase difference signal PD for a symbol index r, and sgn represents the sign or signum operator. As can be seen, the TEE algorithm is herein executed via a combination of simple add, shift and sign operations.

The averaging circuit 23 may be configurable to adjust the number of timing error estimate samples to be averaged in order to increase the timing error detection performance under low signal-to-noise ratio conditions.

Figure 4:
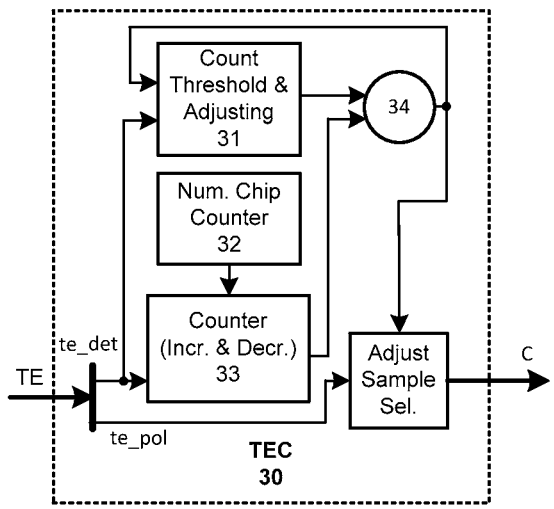
FIG. 4 illustrates an embodiment of the timing error control module of FIG. 2.

An embodiment of the timing error control (TEC) 30 is illustrated with more detail in FIG. 4. In the TEC module the timing error signal TE (containing the te_det and te_pol indication) is evaluated. For each baseband symbol period, the timing error counter value is increased by a configurable value if a timing error has been detected. It is decreased by a configurable value if no timing error has been detected. The counting process can be delayed over a configurable number of symbols to allow for an initial delay when starting the timing synchronization. If the timing error counter has reached a configurable threshold value, a sampling adjustment signal is output to a sampling control circuit 40. The threshold value is adjusted according to a specific communication standard. The adjustment signal (C) determines whether the sampling instant outputted by the control circuit 40 should be delayed or advanced. The timing error counter threshold value can be increased by a configurable value after each adjustment to allow for fewer adjustments after the initial adjustment phase.

Figure 5:
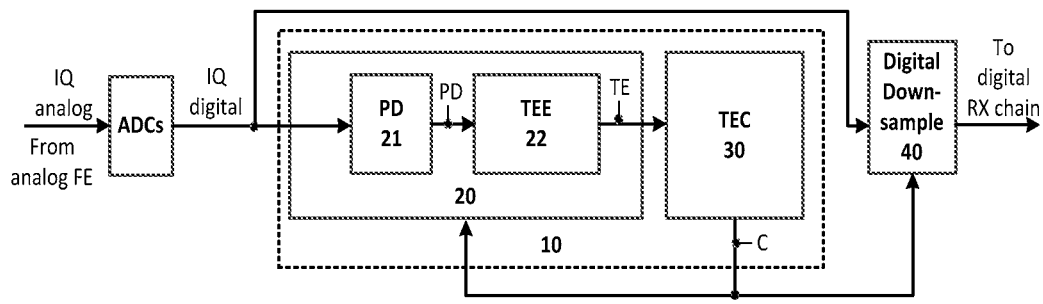
FIG. 5 illustrates an embodiment wherein the timing synchronization circuit precedes the downsampling.
Figure 6:
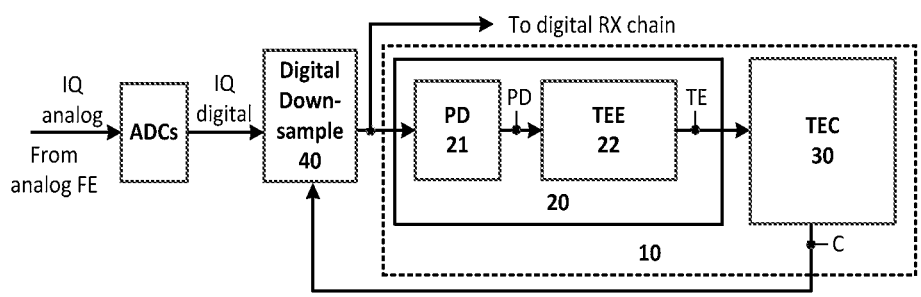
FIG. 6 illustrates an embodiment wherein the downsampling precedes the timing synchronization circuit.

As explained previously, typically, the received baseband signal is oversampled by the ADC. Thus, N samples per symbol-period, where N represents the oversampling rate, are provided to a timing sync circuit 10, examples of which are shown in FIGS. 5 and 6. The timing sync circuit 10 process the input data samples and outputs an adjustment signal C to adjust the initial timing synchronization. The correction of the timing, herein, is done by controlling which one of the N samples is passed for further processing to the rest of the receiver chain. This approach is shown in more details in FIG. 5. The digital downsample circuit 40 selects an optimum sampling instant aligned with the desired sampling instants according to the adjustment signal C. Thus, the downsampling circuit outputs a selected sample once per symbol-period, e.g., once for every N samples, to downsample the incoming oversampled data to the actual symbol rate. The selection of an optimum sampling instant shifts to an earlier sampling instant or to a later sampling instant when the sampling control signal C is changed by the timing sync control 10. By simply controlling which sample is selected for further processing, usage of complex circuitry for directly controlling the sampling clock of the ADC, as in conventional approaches, may be avoided or reduced.

As the TED operates on oversampled baseband data, the timing error estimator signal tee may be downsampled before processing to the actual symbol rate in order to derive the timing error estimate per symbol. The downsampled block 26 performs the downsampling of the tee signal according to the same sampling adjustment signal C used to control the digital downsample circuit 40. The benefit of this approach is that the effect of correcting the initial timing synchronization can be observed more quickly. The convergence speed of the timing synchronization loop is thus increased, which is beneficial for wireless frames with short preamble structures.

Alternatively, the selection of an optimum sampling instant may be performed prior the timing synchronization circuit 10, as shown in the example of FIG. 6. In that case, the timing synchronization circuit 10, and respectively the TED 20, receives downsampled to actual symbol rate input baseband data. The downsample circuit 26, thus, has to be by-passed. To control, whether or not to downsample the tee signal before processing, a multiplexor as shown in FIG. 3 may be used. The downsample circuit 26 and its associate control circuit (i.e. a multiplexer) are optional.

For allowing multi-standard operation of the proposed circuit, supporting different modulation schemes and symbol rates, the PD calculation unit 21 in an embodiment of the disclosure is implemented with a configurable input data delay line to allow phase difference calculation between incoming data samples that are either adjacent or spaced further apart. As already mentioned, the data samples can be phase data samples or I/Q data sample pairs. Similarly, the TEE unit 22 may also be implemented with a configurable input data delay line to allow the calculation of timing error estimate values based on phase difference data values that are adjacent or spaced further apart.

The proposed timing synchronization circuit may be used in parallel with circuitry for carrier frequency offset compensation. In case no large CFO is detected, the timing synchronization circuit of the disclosure starts functioning immediately after the packet starts. When a large CFO is detected, the timing synchronization circuit starts functioning after the CFO is partially compensated. This way, the resulting DC offset will not impair the polarity of the signal pattern. This may be beneficial for certain wireless standards such as BTLE, which allow for a very large carrier frequency offset (CFO). This frequency offset is reflected as DC offset to the signal after differential detector. With the larger DC offset resulting from larger frequency offset, the polarity of the original preamble pattern is lost. This may inhibit the timing error function, such as the Gardner algorithm, where the error estimation is only updated when two adjacent symbols are binary different. Therefore, it may be beneficial to keep the CFO compensation path in parallel to the timing synchronization path.

In summary, the proposed timing synchronization circuit may provide one or more of the following advantages. One advantage is that it does not rely on the presence of certain predefined data patterns in the incoming phase data samples or I/Q data sample pairs, as required in correlation based synchronization approaches. Hence, the proposed timing synchronization circuit can be used with a variety of modulation schemes, not only for initial synchronization at the beginning of a wireless data packet or frame but also for the purpose of timing tracking, e.g., for determining whether the downsampling process needs to be adjusted during receiving other parts of the wireless data packet or frame. This facilitates the use of a single circuit to realize both an initial synchronization and timing tracking while supporting different communication standards. In combination with the multiplier-less and low complexity timing error estimation module, the proposed timing synchronization circuit may thus significantly reduce device costs, area footprint and power consumption.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A timing synchronization circuit for a digital receiver structure, comprising:
    a timing error detection module comprising a phase difference calculation unit arranged for calculating a phase difference between incoming samples of a digital data stream, and a timing error estimator arranged for determining a timing error estimate based on the calculated phase difference, and for generating, based on the determined timing error estimate, a signal indicative of timing error detection; and
    a timing error control module arranged for receiving the signal indicative of timing error detection, for evaluating a number of received signals indicative of timing error detection, and for outputting, responsive to a comparison of the number of received signals indicative of timing error detection with a threshold value, a sampling adjustment command for adjusting sampling instants applied for obtaining the digital data stream,
    and wherein the timing error detection module is arranged for receiving the sampling adjustment command.

2. The timing synchronization circuit as in claim 1, wherein the phase difference calculation unit is adapted for implementing a configurable delay.

3. The timing synchronization circuit as in claim 1, wherein the incoming samples are applied in in-phase/quadrature pairs.

4. The timing synchronization circuit as in claim 1, wherein the timing error estimator comprises a register of configurable length for storing a plurality of the timing error estimates.

5. The timing synchronization circuit as in claim 4, wherein the timing error detection module is further arranged for performing an averaging of the stored timing error estimates, yielding an averaged timing error estimate.

6. The timing synchronization circuit as in claim 5, wherein the timing error estimator is arranged for comparing the timing error estimate or the averaged timing error estimate with a threshold level.

7. The timing synchronization circuit as in claim 6, wherein the timing error estimator is arranged for generating, based on the comparison of the timing error estimate or the averaged timing error estimate with the threshold level, the signal indicative of timing error detection.

8. The timing synchronization circuit as in claim 1, wherein the signal indicative of timing error detection comprises an indication of the polarity of the timing error estimate.

9. The timing synchronization circuit as in claim 1, wherein the timing error detection module is arranged for performing a downsampling on the timing error estimate.

10. The timing synchronization circuit as in claim 1, wherein the timing error detection module is arranged for downsampling the timing error estimate according to the sampling adjustment command.

11. The timing synchronization circuit as in claim 1, wherein the incoming samples are modulated according to a frequency shift keying or phase shift keying modulation scheme.

12. A digital receiver structure comprising:
    a downsampling block arranged for downsampling a received input stream, thereby obtaining a digital data stream;
    a timing error detection module comprising a phase difference calculation unit arranged for calculating a phase difference between incoming samples of the digital data stream, and a timing error estimator arranged for determining a timing error estimate based on the calculated phase difference, and for generating, based on the determined timing error estimate, a signal indicative of timing error detection; and
    a timing error control module arranged for receiving the signal indicative of timing error detection, for evaluating a number of received signals indicative of timing error detection, and for outputting, responsive to a comparison of the number of received signals indicative of timing error detection with a threshold value, a sampling adjustment command for adjusting sampling instants applied for obtaining the digital data stream,
    and wherein the downsampling block is arranged for receiving the sampling adjustment command.

13. The digital receiver structure as in claim 12, wherein the downsampling block is arranged for downsampling the received input stream according to the sampling adjustment command.

14. A timing synchronization circuit for a digital receiver structure, comprising:
    a timing error detection module comprising a phase difference calculation unit arranged for calculating a phase difference between incoming samples of a digital data stream, and a timing error estimator arranged for determining a plurality of timing error estimates based on the calculated phase difference, for generating an averaged timing error estimate based on the plurality of timing error estimates, and for generating, based on a comparison of the plurality of timing error estimates or the averaged timing error estimate with a first threshold, a signal indicative of timing error detection; and
    a timing error control module arranged for receiving the signal indicative of timing error detection, for evaluating a number of received signals indicative of timing error detection, and for outputting, responsive to a comparison of the number of received signals indicative of timing error detection with a second threshold, a sampling adjustment command for adjusting sampling instants applied for obtaining the digital data stream.

* * * * *